United States Patent
You

(10) Patent No.: US 8,716,710 B2
(45) Date of Patent: May 6, 2014

(54) THIN-FILM TRANSISTOR ARRAY SUBSTRATE AND METHOD OF FABRICATING THE SAME

(75) Inventor: Chun-Gi You, Asan-si (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 72 days.

(21) Appl. No.: 13/219,044

(22) Filed: Aug. 26, 2011

(65) Prior Publication Data

US 2012/0193624 A1    Aug. 2, 2012

(30) Foreign Application Priority Data

Feb. 1, 2011 (KR) .................. 10-2011-0010348

(51) Int. Cl.
*H01L 27/06* (2006.01)
*H01L 21/8234* (2006.01)

(52) U.S. Cl.
USPC ......... 257/57; 257/71; 257/E27.016; 438/155

(58) Field of Classification Search
USPC ........... 257/57, 359, 223, 227, 291, 292, 439, 257/443, 655
See application file for complete search history.

(56) References Cited

U.S. PATENT DOCUMENTS

| | | | | |
|---|---|---|---|---|
| 7,880,822 B2* | 2/2011 | Shimizu | ...................... | 349/38 |
| 8,077,266 B2* | 12/2011 | Nakamura et al. | ............. | 349/43 |
| 8,354,669 B2* | 1/2013 | No et al. | ...................... | 257/40 |
| 2007/0090421 A1* | 4/2007 | Jung | ........................... | 257/291 |
| 2010/0123846 A1* | 5/2010 | Kim et al. | ...................... | 349/46 |

FOREIGN PATENT DOCUMENTS

| | | | |
|---|---|---|---|
| KR | 10-426031 B1 | 3/2004 |
| KR | 10-0898694 B1 | 5/2009 |
| KR | 10-0958640 B1 | 5/2010 |

* cited by examiner

*Primary Examiner* — Marc Armand
*Assistant Examiner* — Quinton Brasfield
(74) *Attorney, Agent, or Firm* — Robert E. Bushnell, Esq.

(57) ABSTRACT

A thin-film transistor (TFT) array substrate comprises: a substrate; an active layer and a capacitor first electrode formed on the substrate; a gate insulating film formed on the substrate, the active layer and the capacitor first electrode; a gate electrode formed on the gate insulating film corresponding to the active layer and a capacitor second electrode formed on the gate insulating film corresponding to the capacitor first electrode; an interlayer insulating film formed on the gate insulating film, the gate electrode, and the capacitor second electrode; and a pixel electrode, a source electrode, and a drain electrode formed on the interlayer insulating film; wherein at least one of the source electrode and the drain electrode is formed on the pixel electrode. A method of fabricating the TFT array substrate is also disclosed.

12 Claims, 16 Drawing Sheets

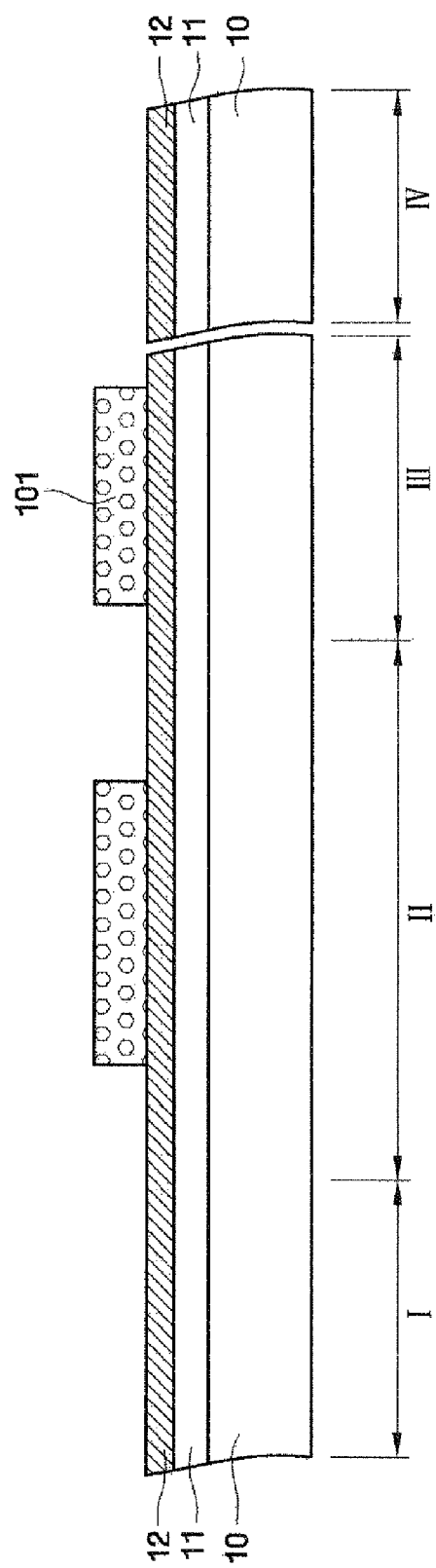
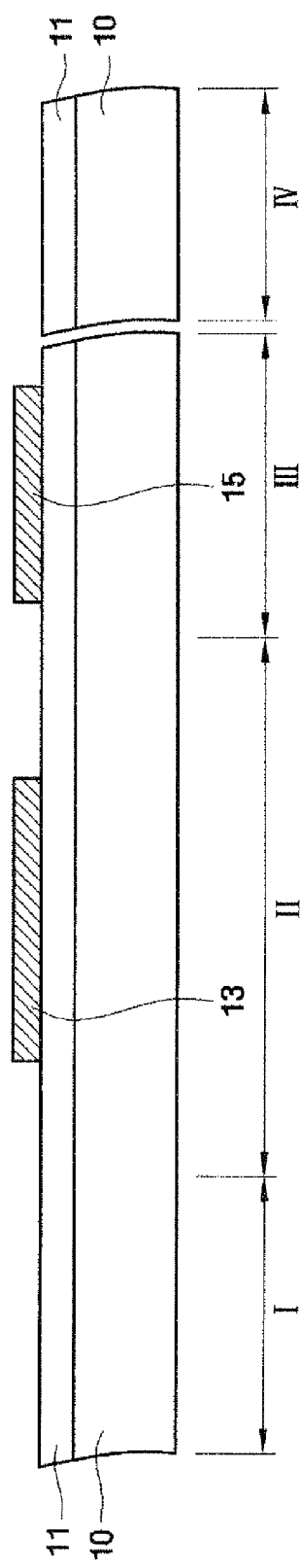

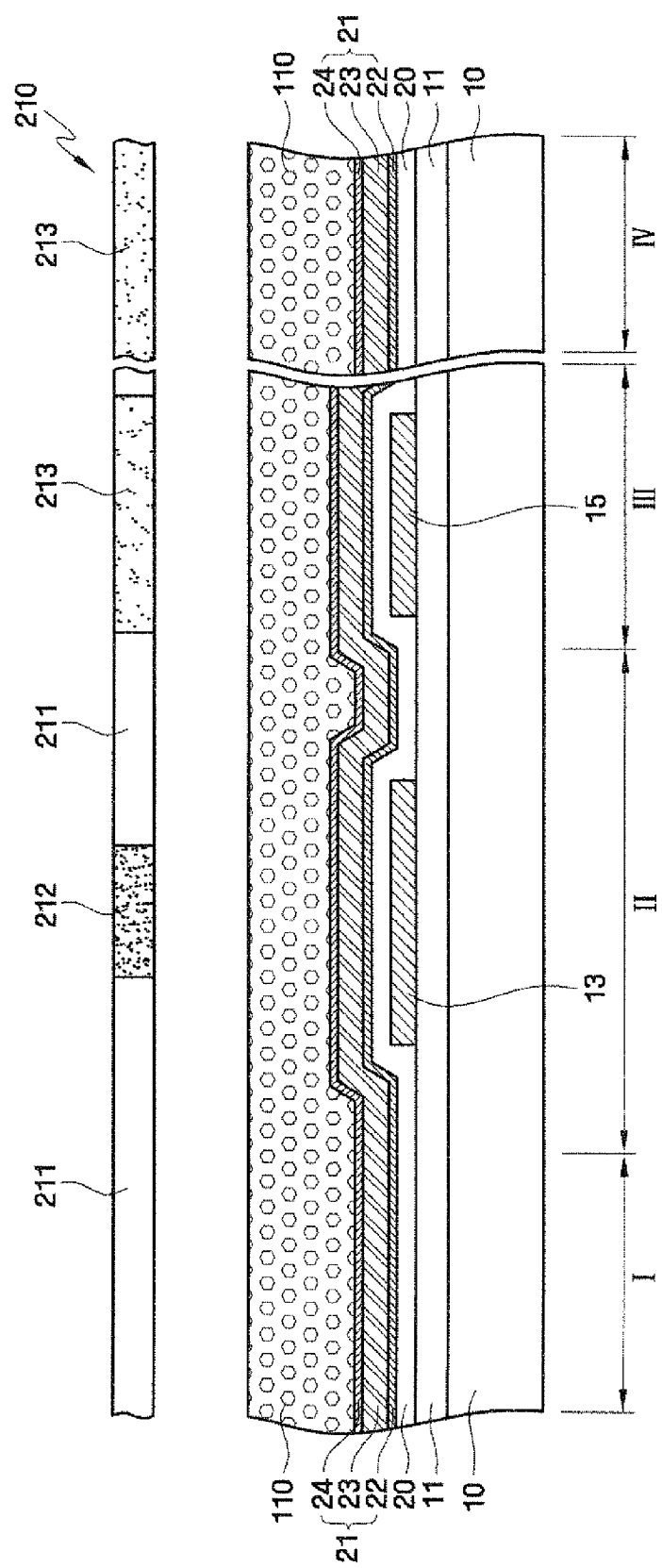

THIN-FILM TRANSISTOR ARRAY SUBSTRATE AND METHOD OF FABRICATING THE SAME

CLAIM OF PRIORITY

This application makes reference to, incorporates the same herein, and claims all benefits accruing under 35 U.S.C. §119 from an application earlier filed in the Korean Intellectual Property Office on 1 Feb. 2011 and there duly assigned Serial No. 10-2011-0010348.

BACKGROUND OF THE INVENTION

1. Field of the Invention

The present invention relates to a thin-film transistor (TFT) array substrate and a method of fabricating the same.

2. Description of the Related Art

Generally, a thin-film transistor (TFT) array substrate comprises a substrate having capacitors and TFTs, and is used to produce the so-called active matrix flat panel display in which the operation of each pixel or subpixel is controlled by a TFT electrically connected to the pixel or subpixel.

A TFT array substrate includes a plurality of TFTs, and fine patterns are formed in each TFT. To form these fine patterns, many processes are performed. In that regard, various methods may be used to form the fine patterns. Among the methods, photolithography using masks is being widely used.

Photolithography is a process which requires precise control. In addition, forming patterns using masks involves many processes such as forming, exposing, developing and etching of a photoresist. Since photolithography using masks involves many processes, it makes the process of fabricating a flat panel display complicated and increases the processing time. Furthermore, photolithography using masks makes process management difficult, causing defects.

SUMMARY OF THE INVENTION

The present invention provides a thin-film transistor (TFT) array substrate which can be fabricated in a simplified process, and which employs wirings appropriate for device characteristics.

The present invention also provides a method of fabricating a TFT array substrate, which employs wirings appropriate for device characteristics, in a simplified process.

However, the aspects, features and advantages of the present invention are not restricted to the ones set forth herein. The above and other aspects, features and advantages of the present invention will become more apparent to one of ordinary skill in the art to which the present invention pertains by referencing the detailed description of the present invention given below.

According to an aspect of the present invention, a thin-film transistor (TFT) array substrate comprises: a substrate; an active layer and a capacitor first electrode formed on the substrate; a gate insulating film formed on the substrate, the active layer and the capacitor first electrode; a gate electrode formed on the gate insulating film corresponding to the active layer and a capacitor second electrode formed on the gate insulating film corresponding to the capacitor first electrode; an interlayer insulating film formed on the gate insulating film, the gate electrode, and the capacitor second electrode; and a pixel electrode, a source electrode, and a drain electrode formed on the interlayer insulating film; wherein at least one of the source electrode and the drain electrode is formed on the pixel electrode.

According to another aspect of the present invention, a method of fabricating a TFT array substrate comprises: forming an active layer and a capacitor first electrode on a substrate; forming a gate insulating film on the substrate, the active layer, and the capacitor first electrode; forming a gate electrode and a capacitor second electrode on the gate insulating film; sequentially forming an interlayer insulating film and a conductive film so as to form a pixel electrode on the gate insulating film, the gate electrode, and the capacitor second electrode; forming contact holes which expose predetermined regions of the active layer by etching predetermined regions of the conductive film so as to form the pixel electrode, the interlayer insulating film, and the gate insulating film; forming a conductive film so as to form source and drain electrodes on the conductive film for forming the pixel electrode; forming a first photoresist pattern on the conductive film so as to form the source and drain electrodes using a halftone mask; and forming the source and drain electrodes and the pixel electrode by etching the conductive film so as to form the source and drain electrodes and the conductive film for forming the pixel electrode using the first photoresist pattern as an etch mask.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein:

FIGS. 2 thru 17 are cross-sectional views sequentially illustrating a method of fabricating a TFT array substrate according to an exemplary embodiment of the present invention.

DETAILED DESCRIPTION OF THE INVENTION

Figure 1:
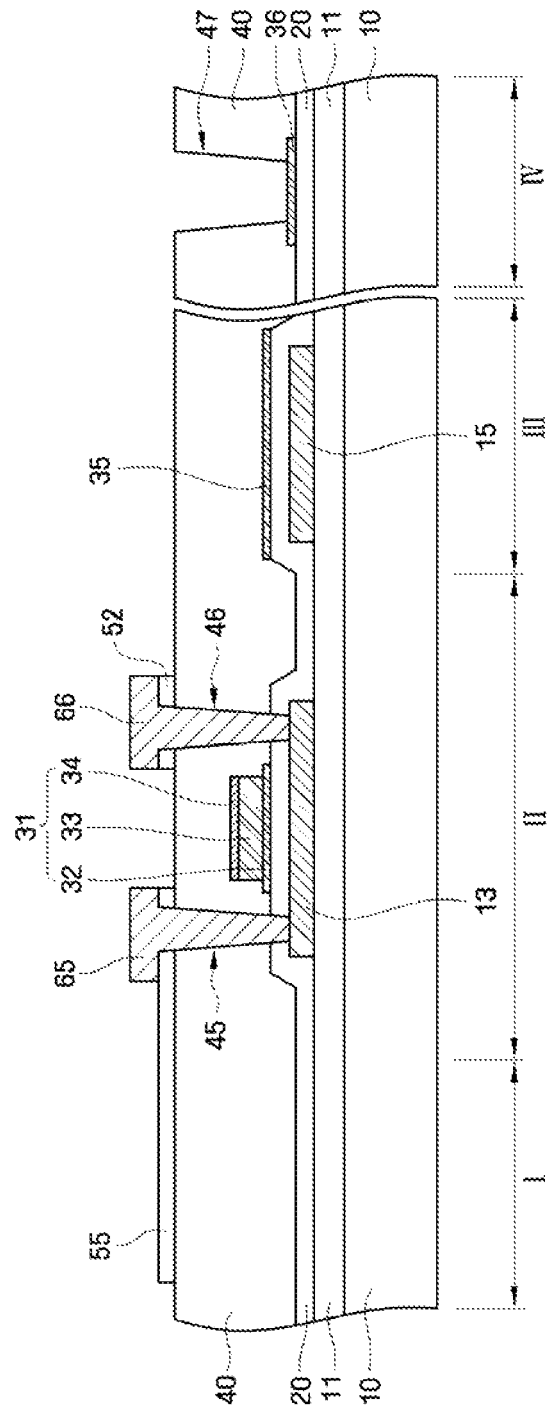
FIG. 1 is a schematic cross-sectional view of a thin-film transistor (TFT) array substrate according to an exemplary embodiment of the present invention.

Advantages and features of the present invention and methods of accomplishing the same may be understood more readily by reference to the following detailed description of exemplary embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. In the drawings, sizes and relative sizes of elements may be exaggerated for clarity.

Like reference numerals refer to like elements throughout the specification. As used herein, the term "and/or" includes any and all combinations of one or more of the associated listed items.

The terminology used herein is for the purpose of describing particular embodiments only and is not intended to be limiting of the invention. As used herein, the singular forms are intended to include the plural forms as well, unless the context clearly indicates otherwise. It will be further understood that the terms "comprises" and/or "made of," when used in this specification, specify the presence of stated components, steps, operations, and/or elements, but do not preclude the presence or addition of one or more other components, steps, operations, elements, and/or groups thereof.

It will be understood that, although the terms first, second, third, etc. may be used herein to describe various elements, these elements should not be limited by these terms. These terms are only used to distinguish one element from another element. Thus, a first element discussed below could be termed a second element without departing from the teachings of the present invention Embodiments of the invention are described herein with reference to planar and cross-section illustrations which are schematic illustrations of idealized embodiments of the invention. As such, variations from the shapes of the illustrations, as a result, (for example) of manufacturing techniques and/or tolerances, are to be expected. Thus, embodiments of the invention should not be construed as limited to the particular shapes of regions illustrated herein but are to include deviations in shapes which result, for example, from manufacturing. Thus, the regions illustrated in the figures are schematic in nature, and their shapes are not intended to illustrate the actual shape of a region of a device, and are not intended to limit the scope of the invention.

Unless otherwise defined, all terms (including technical and scientific terms) used herein have the same meaning as commonly understood by one of ordinary skill in the art to which this invention pertains. It will be further understood that terms, such as those defined in commonly used dictionaries, should be interpreted as having a meaning which is consistent with their meaning in the context of the relevant art, and should not be interpreted in an idealized or overly formal sense unless expressly so defined herein.

A thin-film transistor (TFT) array substrate according to an exemplary embodiment of the present invention will be described with reference to FIG. 1.

FIG. 1 is a schematic cross-sectional view of a TFT array substrate according to an exemplary embodiment of the present invention.

Referring to FIG. 1, the TFT array substrate according to the current exemplary embodiment includes a substrate 10, an active layer 13, a gate electrode 31, source and drain electrodes 66 and 65, respectively, a pixel electrode 55, a capacitor first electrode 15, a capacitor second electrode 35, and a pad 36.

The TFT array substrate includes a light-emitting region 1, a TFT region II, a capacitor region III, and a pad region IV. TFTs are formed in the TFT region II. At least one TFT may be formed in each pixel. In FIG. 1, one TFT formed in a pixel is illustrated. However, this is merely an example for ease of description, and the present invention is not limited to this example. That is, a plurality of TFTs can be formed in each pixel.

The substrate 10 may be made of a transparent glass material containing $SiO_2$ as a main component. However, the material which forms the substrate 10 is not limited to the transparent glass material. The substrate 10 may also be made of a transparent plastic material which may be an insulating organic material selected from the group consisting of polyethersulphone (PES), polyacrylate (PAR), polyetherimide (PEI), polyethylene napthalate (PEN), polyethylene terephthalate (PET), polyphenylene sulfide (PPS), polyallylate, polyimide, polycarbonate (PC), cellulose triacetate (TAC), and cellulose acetate propionate (CAP).

A buffer layer 11 may be disposed on the substrate 10 so as to form an even surface on the substrate 10 and prevent penetration of impurities into the substrate 10. The buffer layer 11 may be made of $SiO_2$ and/or $SiN_x$.

The active layer 13 and the capacitor first electrode 15 are formed on the buffer layer 11. The active layer 13 and the capacitor first electrode 15 may be made of an inorganic or organic semiconductor such as amorphous silicon or polysilicon. The active layer 13 may include a source region, a drain region, and a channel region. The source and drain regions may be formed by injecting impurities into the active layer 13 made of amorphous silicon or polysilicon. In this regard, donor impurity ions, such as P, As or Sb, may be injected so as to manufacture an N-type TFT, and acceptor impurity ions, such as B, Al, Ga or In, may be injected so as to manufacture a P-type TFT. The capacitor first electrode 15 may be formed by injecting impurities into an inorganic or organic semiconductor such as amorphous silicon or polysilicon so that the inorganic or organic semiconductor has conductivity.

A gate insulating film 20 is formed on the buffer layer 11, the active layer 13, and the capacitor first electrode 15. The gate insulating film 20 insulates the active layer 13 from the gate electrode 31 and forms an insulator between the capacitor first electrode 15 and the capacitor second electrode 35. The gate insulating film 20 may be an organic insulating film or an inorganic insulating film made of, e.g., $SiN_x$, $SiO_2$ or SiON.

The gate electrode 31, the capacitor second electrode 35, and the pad 36 are formed on the gate insulating film 20. The gate electrode 31 includes a first gate electrode film 32, a second gate electrode film 33, and a third gate electrode film 34 stacked sequentially on the gate insulating film 20. The first gate electrode film 32 may be made of Ti, Ta, or Cr. The second gate electrode film 33 may be made of metal with low resistivity, for example, Al-based metal such as Al or an Al alloy, Ag-based metal such as Ag or an Ag alloy, or Cu-based metal such as Cu or a Cu alloy, in order to reduce the signal delay or voltage drop of the gate electrode 31. In addition, the third gate electrode film 34 may be made of Mo-based metal such as Mo or a Mo alloy. The gate electrode 31 is connected to a gate line (not shown) which transmits an on/off signal of a TFT.

The capacitor second electrode 35 is made of the same film as the first gate electrode film 32 of the gate electrode 31. Referring to FIG. 1, in a state where a conductive film for forming the capacitor second electrode 35 is formed, impurities are injected into an inorganic or organic semiconductor which forms the capacitor first electrode 15. Therefore, the impurities injected into the capacitor first electrode 15 may also be contained in the capacitor second electrode 35. The capacitor second electrode 35 and the gate electrode 31 may have different thicknesses, and the capacitor second electrode 35 and the first gate electrode film 32 of the gate electrode 31 may have equal thicknesses.

The pad 36 is formed in the pad region IV. Like the capacitor second electrode 35, the pad 36 is made of the same film as the first gate electrode film 32 of the gate electrode 31. Since the pad 36 is made of the material which forms the first gate electrode film 32 of the gate electrode 31, such as Ti, Ta or Cr, it may not corrode. The pad 36 and the gate electrode 31 may have different thicknesses, and the pad 36 and the first gate electrode film 32 of the gate electrode 31 may have equal thicknesses.

The second gate electrode film 33 and the third gate electrode film 34 of the gate electrode 31 may be narrower than the first gate electrode film 32. That is, the second gate electrode film 33 and the third gate electrode film 34 may expose a predetermined region of an end of the first gate electrode film 32.

In the current exemplary embodiment, the second gate electrode film 33 made of low-resistance metal, such as Al, is included in the gate electrode 31, while the pad 36 is made of the same film as the first gate electrode film 32 which does not corrode. In addition, the second gate electrode film 33 and the third gate electrode film 34 are removed, and only the first gate electrode film 32 is used as the capacitor second electrode 35. Therefore, impurities can be simultaneously injected into the capacitor first electrode 15 and the active layer 13 without using a mask. Furthermore, in the current exemplary embodiment, since the gate electrode 31, the capacitor second electrode 35, and the pad 36 are formed using one halftone mask, the number of masks used can be reduced.

An interlayer insulating film 40 is formed on the gate insulating film 20, the gate electrode 31, the capacitor second electrode 35, and the pad 36. Contact holes 45 and 46 exposing the source and drain regions, respectively, of the active layer 13, and a hole 47 exposing a predetermined region of the pad 36 are formed in the interlayer insulating film 40, and in the gate insulating film 20, with respect to contact holes 45 and 46. In the current exemplary embodiment, since the pixel electrode 55 is formed on the interlayer insulating film 40 so as to be in direct contact with the interlayer insulating film 40, the interlayer insulating film 40 may be formed so as to have an even top surface. However, the present invention is not limited thereto. The interlayer insulating film 40 may also be formed along the steps of the underlying layers, and thus have an uneven top surface.

The interlayer insulating film 40 may be made of an inorganic insulating film or an organic insulating film. Examples of the inorganic insulating film which forms the interlayer insulating film 40 include $SiO_2$, $SiN_x$, $SiON$, $Al_2O_3$, $TiO_2$, $Ta_2O_5$, $HfO_2$, $ZrO_2$, BST and PZT, and examples of the organic insulating film include general-purpose polymer (such as polymethylmethacrylate (PMMA) or polystyrene (PS)), polymer derivatives having a phenol group, acrylic polymer, imide polymer, aryl ether polymer, amide polymer, fluorine polymer, p-xylene polymer, vinyl alcohol polymer, and a blend of these materials. The interlayer insulating film 40 may also be made of a composite stack of the inorganic insulating film and the organic insulating film.

The pixel electrode 55 is formed on the interlayer insulating film 40. Specifically, the pixel electrode 55 is formed on the interlayer insulating film 40 so as to be in direct contact with the interlayer insulating film 40. The pixel electrode 55 may be made of a transparent conductive film containing one or more transparent materials selected from ITO, IZO, ZnO, and $In_2O_3$.

The source and drain electrodes 66 and 65, respectively, are formed on the pixel electrode 55. Specifically, any one (e.g., the drain electrode 65) of the source and drain electrodes 66 and 65, respectively, is formed on the pixel electrode 55 so as to be in direct contact with the pixel electrode 55, and the other one (e.g., the source electrode 66) of the source and drain electrodes 66 and 65, respectively, is formed on a conductive film pattern 52 for forming the pixel electrode so as to be in direct contact with the conductive film pattern 52 formed on the interlayer insulating film 40. Otherwise, the source electrode 66 may be formed on the pixel electrode 55 so as to be in direct contact with the pixel electrode 55, and the drain electrode 65 may be formed on the conductive film pattern 52 for forming the pixel electrode so as to be in direct contact with the conductive film pattern 52 formed on the interlayer insulating film 40.

The source and drain electrodes 66 and 65, respectively, may be a single layer of a material selected from the group consisting of Mo, W, MoW, AlNd, Ti, Al, an Al alloy, Ag, and an Ag alloy. Alternatively, the source and drain electrodes 66 and 65, respectively, may be made up of two or more layers of Mo, Al or Ag, which are low-resistance materials, in order to reduce wiring resistance. That is, the source and drain electrodes 66 and 65, respectively, may have a multilayered structure selected from the group consisting of Mo/Al/Mo, MoW/AlNd/MoW, Ti/Al/Ti, Mo/Ag/Mo, and Mo/Ag alloy/Mo. The source and drain electrodes 66 and 65, respectively, are connected to the source and drain regions, respectively, of the active layer 13 by the contact holes 46 and 45, respectively.

In the current exemplary embodiment, a conductive film for forming the pixel electrode 55 is formed on the interlayer insulating film 40, and a conductive film for forming the source and drain electrodes 66 and 65, respectively, is formed on the conductive film for forming the pixel electrode 55. Then, these conductive films are patterned using one halftone mask. Therefore, the number of masks required can be reduced.

The TFT array substrate shown in FIG. 1 can be used in a flat panel display. For example, a common electrode (not shown) may be formed above the pixel electrode 55, and a liquid crystal layer (not shown) may be formed between the pixel electrode 55 and the common electrode, thereby completing a liquid crystal display (LCD).

A method of fabricating a TFT array substrate according to an exemplary embodiment of the present invention will be described with reference to FIGS. 1 thru 17.

FIGS. 2 thru 17 are cross-sectional views sequentially illustrating a method of fabricating a TFT array substrate according to an exemplary embodiment of the present invention. Elements substantially identical to those of FIG. 1 are indicated by like reference numerals, and thus their detailed description will be omitted.

Figure 2:
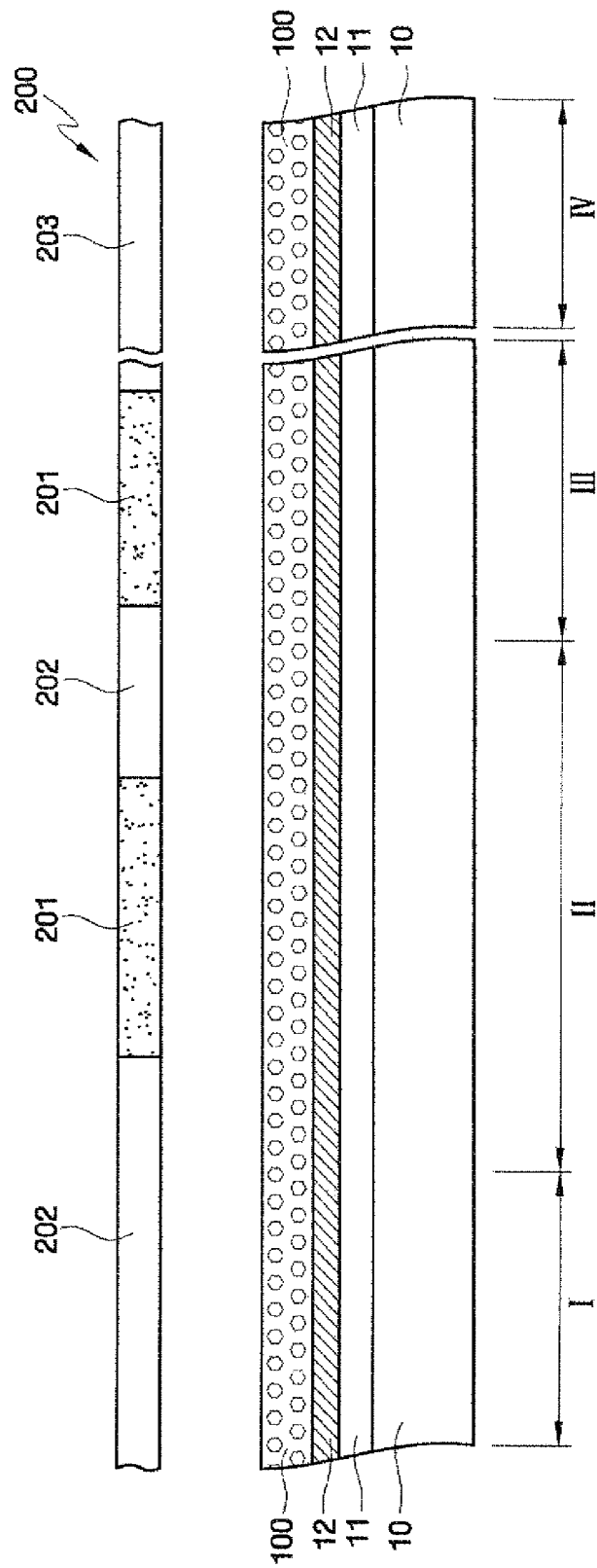

Referring to FIG. 2, a buffer layer 11 and a semiconductor film 12 are sequentially formed on a substrate 10. The buffer layer 11 and the semiconductor film 12 may be deposited by, e.g., chemical vapor deposition (CVD). When the semiconductor film 12 is made of polysilicon, it may be formed by depositing an amorphous silicon layer on the buffer layer 11 and crystallizing the amorphous silicon layer using eximer laser annealing (ELA), sequential lateral solidification (SLS), metal induced crystallization (MIC), or metal induced lateral crystallization (MILC).

A first photoresist film 100 is formed on the semiconductor film 12. A first photomask 200 is placed above the first photoresist film 100. For ease of description, the case where the first photoresist film 100 is a positive photoresist is described as an example. However, the present invention is not limited to this example, and a negative photoresist may also be used as the first photoresist film 100.

The first photomask 200 includes light-blocking regions 201 and light-transmitting regions 202. The light-transmitting regions 202 allow emitted light to pass therethrough, and the light-blocking regions 201 block the emitted light. The first photomask 200 is positioned so that the light-blocking regions 201 correspond to regions in which an active layer 13 (see FIG. 1) and a capacitor first electrode 15 (see FIG. 1) are to be formed.

Referring to FIGS. 2 and 3, the first photoresist film 100 is exposed to light through the first photomask 200 and is then developed. As a result, regions of the first photoresist film 100 which correspond to the light-transmitting regions 202 are removed, whereas regions of the first photoresist film 100 which correspond to the light-blocking regions 201 remain to form a first photoresist pattern 101.

Referring to FIGS. 3 and 4, the semiconductor film 12 is etched using the first photoresist pattern 101 as an etch mask, thereby forming the active layer 13 and the capacitor first electrode 15.

Referring to FIG. 5, a gate insulating film 20 is formed on the buffer layer 11, the active layer 13, and the capacitor first electrode 15. The gate insulating film 20 may be formed of an organic insulating film or an inorganic insulating film, such as $SiN_x$, $SiO_2$ or SiON by CVD. Next, a gate conductive film 21 for forming a gate electrode 31 (see FIG. 1) is formed on the gate insulating film 20. The gate conductive film 21 may be formed by sequentially stacking a first conductive film 22, a second conductive film 23, and a third conductive film 24 on the gate insulating film 20. The first conductive film 22 may be made of Ti, Ta or Cr, and the second conductive film 23 may be made of Al-based metal such as Al or an Al alloy, Ag-based metal such as Ag or an Ag alloy, or Cu-based metal such as Cu or a Cu alloy. In addition, the third conductive film 24 may be made of Mo-based metal such as Mo or a Mo alloy. The first thru third conductive films 22 thru 24, respectively, may be formed by, e.g., sputtering.

A second photoresist film 110 is formed on the third conductive film 24. A second photomask 210 is placed above the second photoresist film 110. For ease of description, the case where the second photoresist film 110 is a positive photoresist is described as an example. However, the present invention is not limited to this example, and a negative photoresist may also be used as the second photoresist film 110.

The second photomask 210 is a halftone mask which includes light-transmitting regions 211, a light-blocking region 212, and semi-transmitting regions 213. The semi-transmitting regions 213 allow only part of emitted light to pass therethrough. The second photomask 210 is positioned so that the light-blocking region 212 corresponds to a region in which the gate electrode 31 (see FIG. 1) is to be formed, and that the semi-transmitting regions 213 correspond to regions in which a capacitor second electrode 35 (see FIG. 1) and a pad 36 (see FIG. 1) are to be formed.

Figure 6:
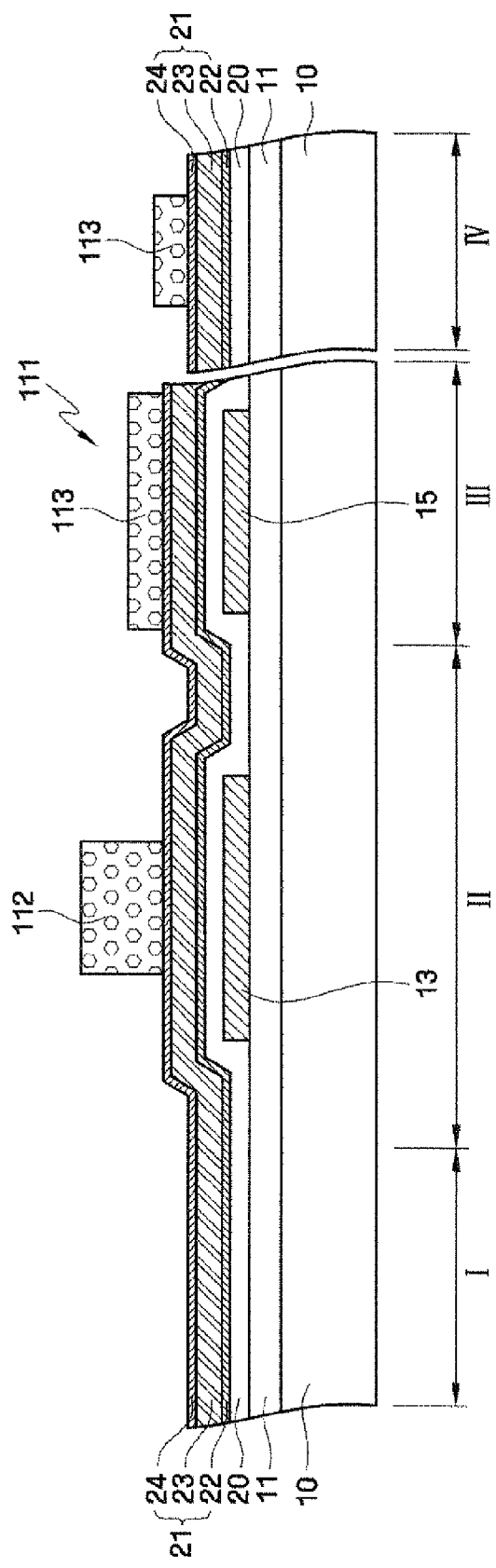

Referring to FIGS. 5 and 6, the second photoresist film 110 is exposed to light through the second photomask 210 and then developed. As a result, regions of the second photoresist film 110 which correspond to the light-transmitting regions 211 are removed, whereas regions of the second photoresist film 110 which correspond to the light-blocking region 211 and the semi-transmitting regions 213 remain to form a second photoresist pattern 111. The second photoresist pattern 111 includes a first sub-photoresist pattern 112 corresponding to the light-blocking region 212 and second sub-photoresist patterns 113 corresponding to the semi-transmitting regions 213. The second sub-photoresist patterns 113 are thinner than the first sub-photoresist pattern 112.

Figure 7:
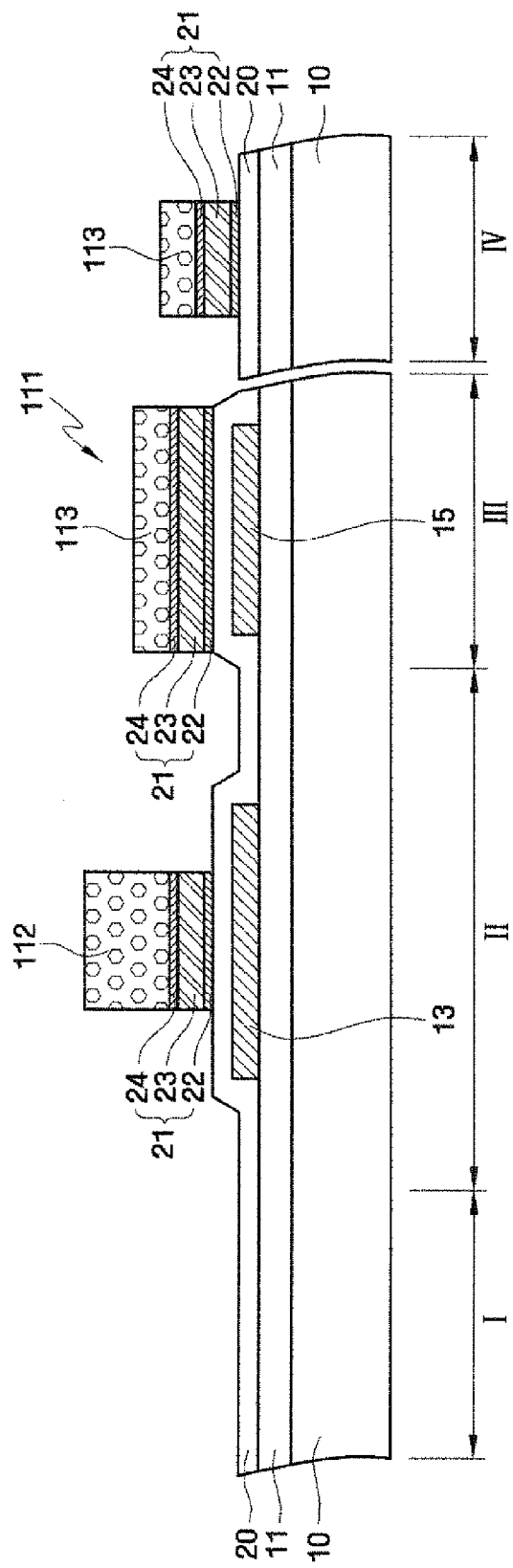

Referring to FIGS. 6 and 7, the gate conductive film 21 is etched using the second photoresist pattern 111 as an etch mask. The etching of the gate conductive film 21 may include wet-etching the third conductive film 24 and the second conductive film 23 and dry-etching the first conductive film 22. In the wet-etching process, an etchant, such as phosphoric acid, nitric acid or acetic acid, may be used. In the dry-etching process, a Cl-based etching gas, such as $Cl_2$ or $BCl_3$, may be used.

Figure 8:
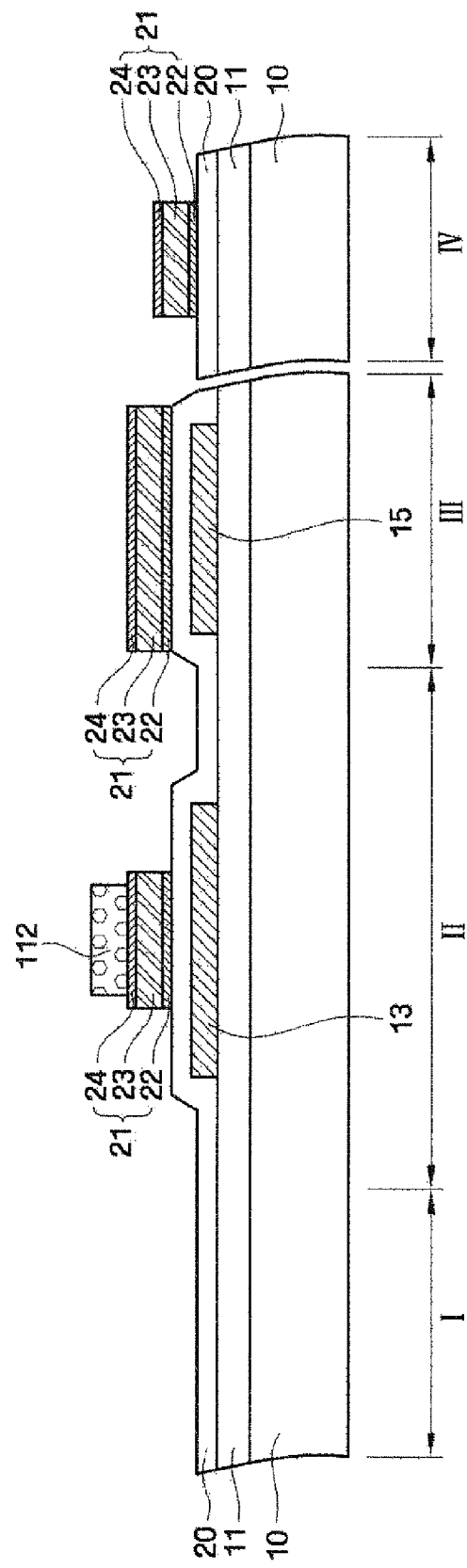

Referring to FIGS. 7 and 8, the second sub-photoresist patterns 113 are removed. The second sub-photoresist patterns 113 may be removed by an ashing process using oxygen. When the second sub-photoresist patterns 113 are removed, the first sub-photoresist pattern 112 may also be partially removed. As a result, the thickness and width of the first sub-photoresist pattern 112 may be reduced.

Figure 9:
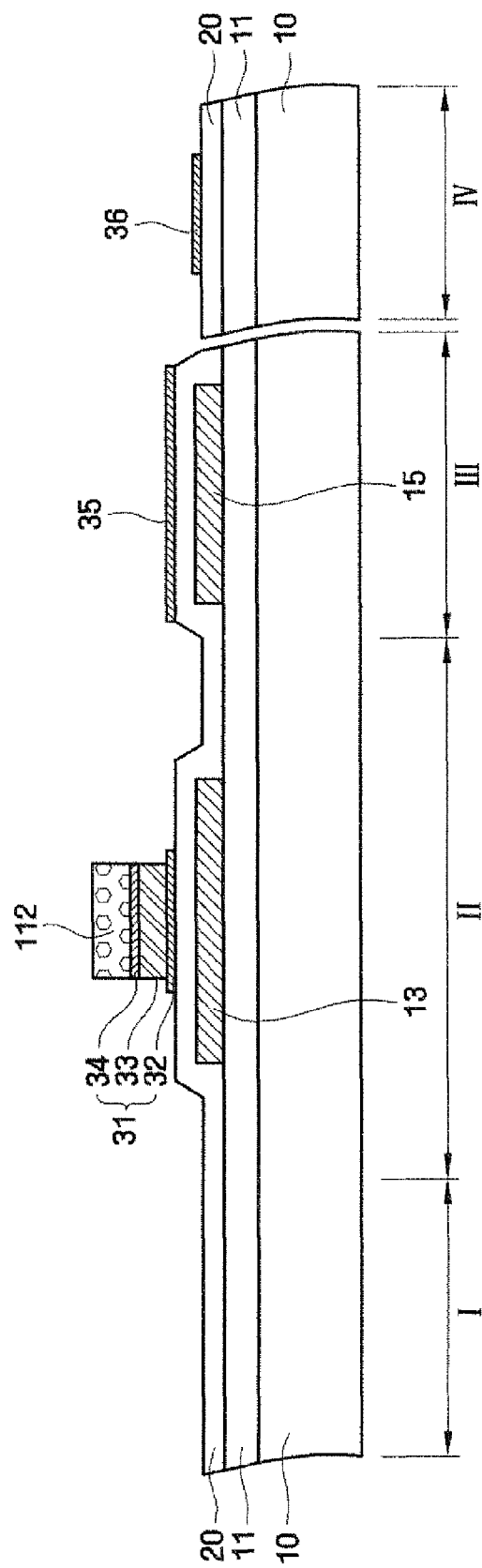

Referring to FIGS. 8 and 9, the third conductive film 24 and the second conductive film 23 are etched again using the remaining first sub-photoresist pattern 112 as an etch mask. For example, the third conductive film 24 and the second conductive film 23 may be wet-etched. In this regard, the third conductive film 24 and the second conductive film 23 of a capacitor region III and a pad region IV are removed. The first conductive film 22 remaining in the capacitor region III becomes the capacitor second electrode 35, and the first conductive film 22 remaining in the pad region IV becomes the pad 36.

The first thru third conductive films 22 thru 24, respectively, remaining in the TFT region II become first through third gate electrode films 32 through 34, respectively. Since the third conductive film 24 and the second conductive film 23 are etched using the first sub-photoresist pattern 112 having the reduced width, the second gate electrode film 33 and the third gate electrode film 34 may be narrower than the first gate electrode film 32. That is, the second gate electrode film 33 and the third gate electrode film 34 may expose a predetermined region of an end of the first gate electrode film 32.

In FIG. 9, both the third conductive film 24 and the second conductive film 23 are removed from the pad region IV. However, the present invention is not limited thereto. The third conductive film 24 and the second conductive film 23 of the pad region IV may be prevented from being removed using a photoresist pattern. Then, they may be removed, for example, when a conductive film for forming source and drain electrodes 66 and 65, respectively, is removed from the pad region IV in a subsequent process.

Figure 10:
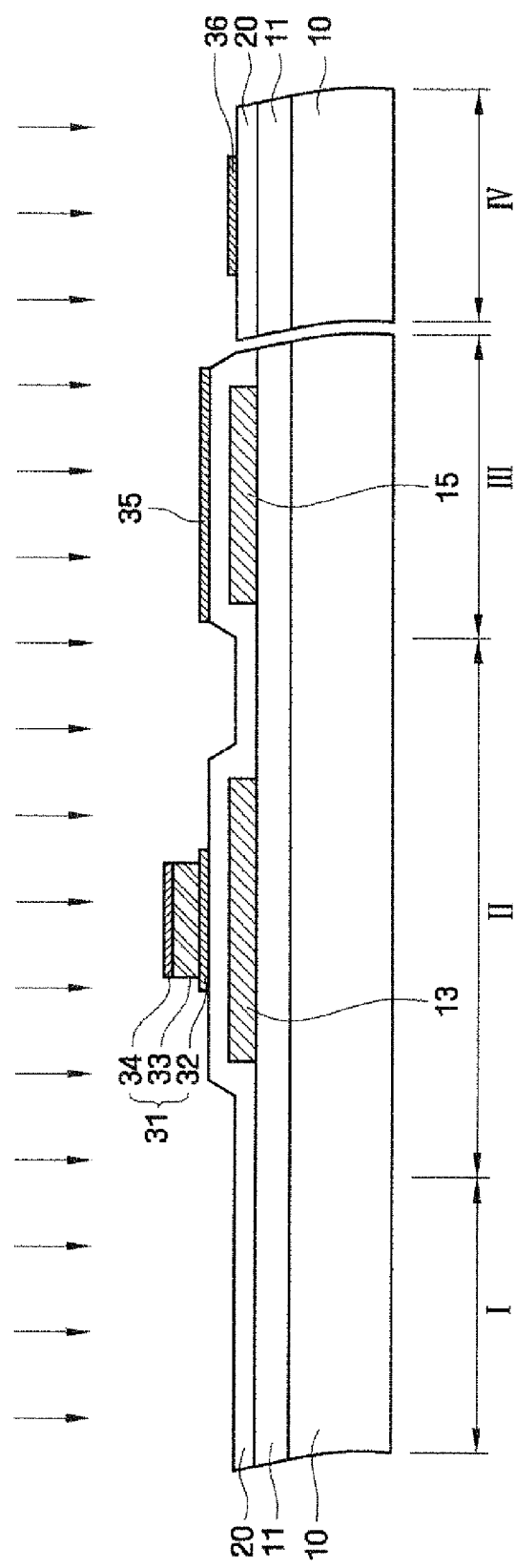

Referring to FIGS. 9 and 10, the first sub-photoresist pattern 112 is removed, and impurity ions are implanted into the active layer 13 and the capacitor first electrode 15. The implantation process of impurity ions may be performed by exposing the entire substrate 10 having the gate electrode 31 and the capacitor second electrode 35 to impurity ions without using a mask. In this regard, the impurity ions are implanted only into regions of the active layer 13 which are exposed by the gate electrode 31. Since the capacitor second electrode 35 is thinner than the gate electrode 31, the impurity ions pass through the capacitor second electrode 35 so as to be injected into the capacitor first electrode 15. Donor impurity ions such as P, As or Sb may be injected to manufacture an N-type TFT, and acceptor impurity ions such as B, Al, Ga or In may be injected to manufacture a P-type TFT. In this regard, since the capacitor second electrode 35 is exposed during the implantation process of impurity ions, impurities doped into the capacitor first electrode 15 may also be doped into the capacitor second electrode 35.

Figure 11:
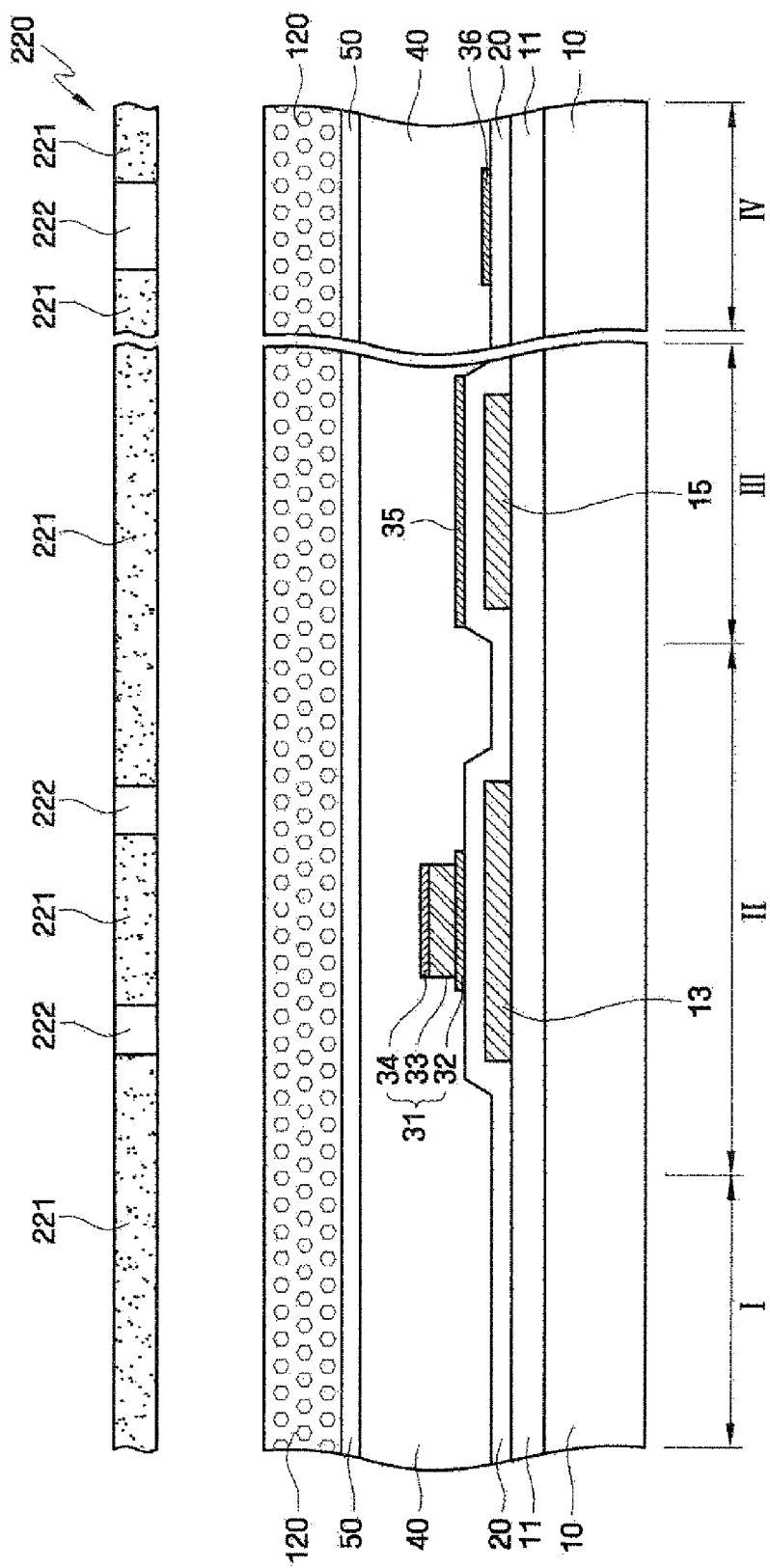

Referring to FIG. 11, an interlayer insulating film 40 and a conductive film 50 for forming a pixel electrode 55 are formed on the gate insulating film 20, the gate electrode 31, the capacitor second electrode 35, and the pad 36. The interlayer insulating film 40 may be formed so as to have an even top surface. The interlayer insulating film 40 may be made of an inorganic insulating film, an organic insulating film, or a composite stack of these films. The conductive film 50 for forming the pixel electrode 55 may be formed on the interlayer insulating film 40 so as to be in direct contact with the interlayer insulating film 40, and may be a transparent conductive film containing one or more transparent materials selected from ITO, IZO, ZnO, and $In_2O_3$.

A third photoresist film 120 is formed on the conductive film 50 for forming the pixel electrode 55. A third photomask 220 is placed above the third photoresist film 120. For ease of description, the case where the third photoresist film 120 is a positive photoresist is described as an example. However, the present invention is not limited to this example, and a negative photoresist may also be used as the third photoresist film 120.

The third photomask 220 includes light-blocking regions 221 and light-transmitting regions 222. The third photomask 220 is positioned so that the light-transmitting regions 222 correspond to regions in which contact holes 45 and 46 (see FIG. 1) and a hole 47 of the pad region IV are to be formed.

Figure 12:
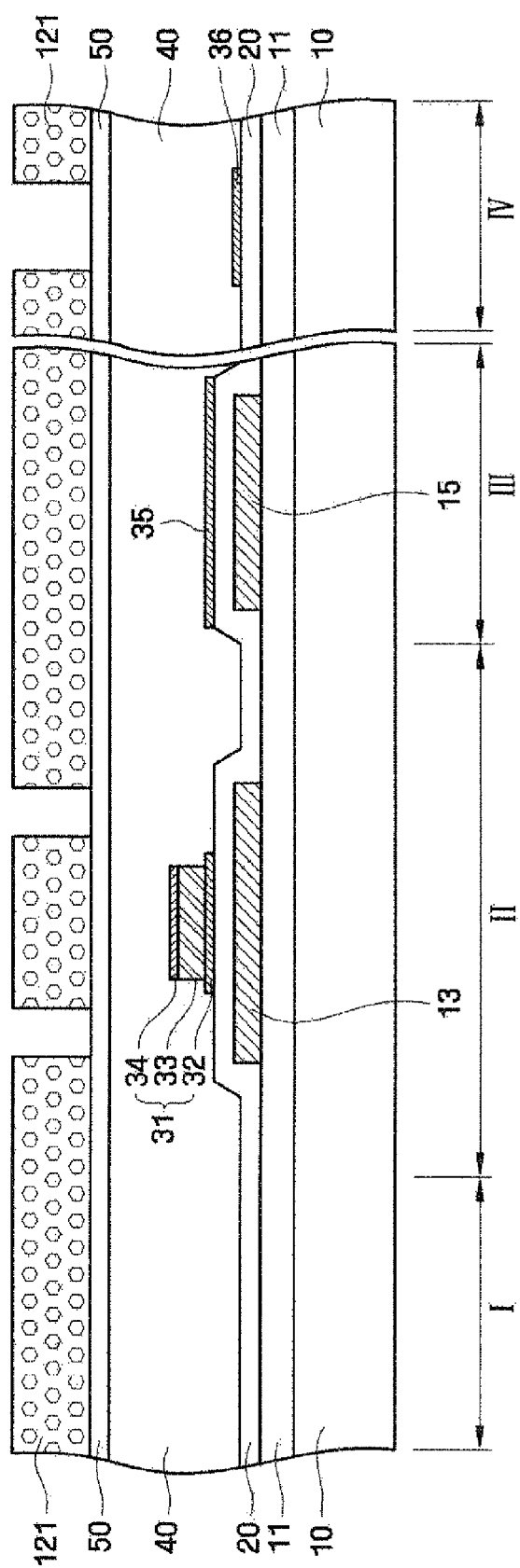

Referring to FIGS. 11 and 12, the third photoresist film 120 is exposed to light through the third photomask 220 and then developed. As a result, regions of the third photoresist film 120 which correspond to the light-transmitting regions 222 are removed, whereas regions of the third photoresist film 120 which correspond to the light-blocking regions 221 remain to form a third photoresist pattern 121.

Figure 13:
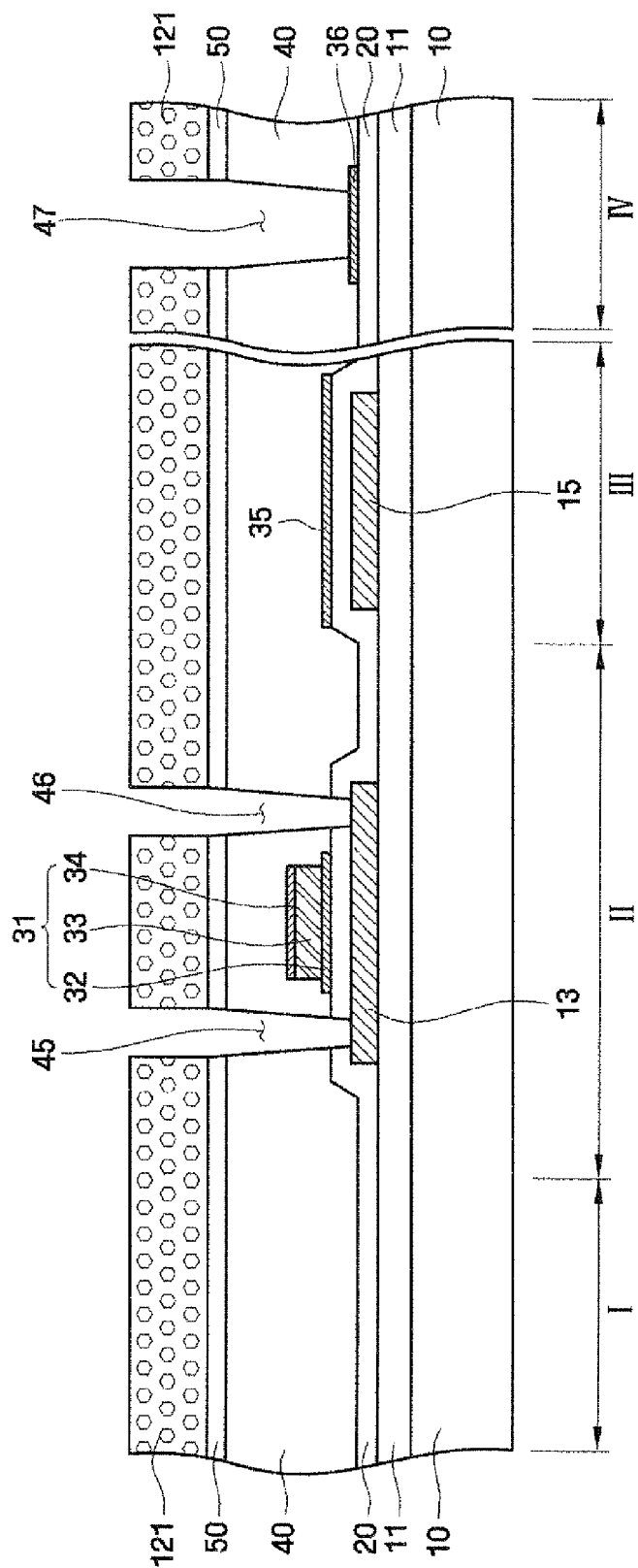

Referring to FIGS. 12 and 13, the interlayer insulating film 40 and the conductive film 50 for forming the pixel electrode 55 are etched using the third photoresist pattern 121 as an etch mask, thereby forming the contact holes 45 and 46 and the hole 47 which exposes a predetermined region of the pad 36. In this regard, the interlayer insulating film 40 and the conductive film 50 for forming the pixel electrode 55 may be dry-etched.

Figure 14:
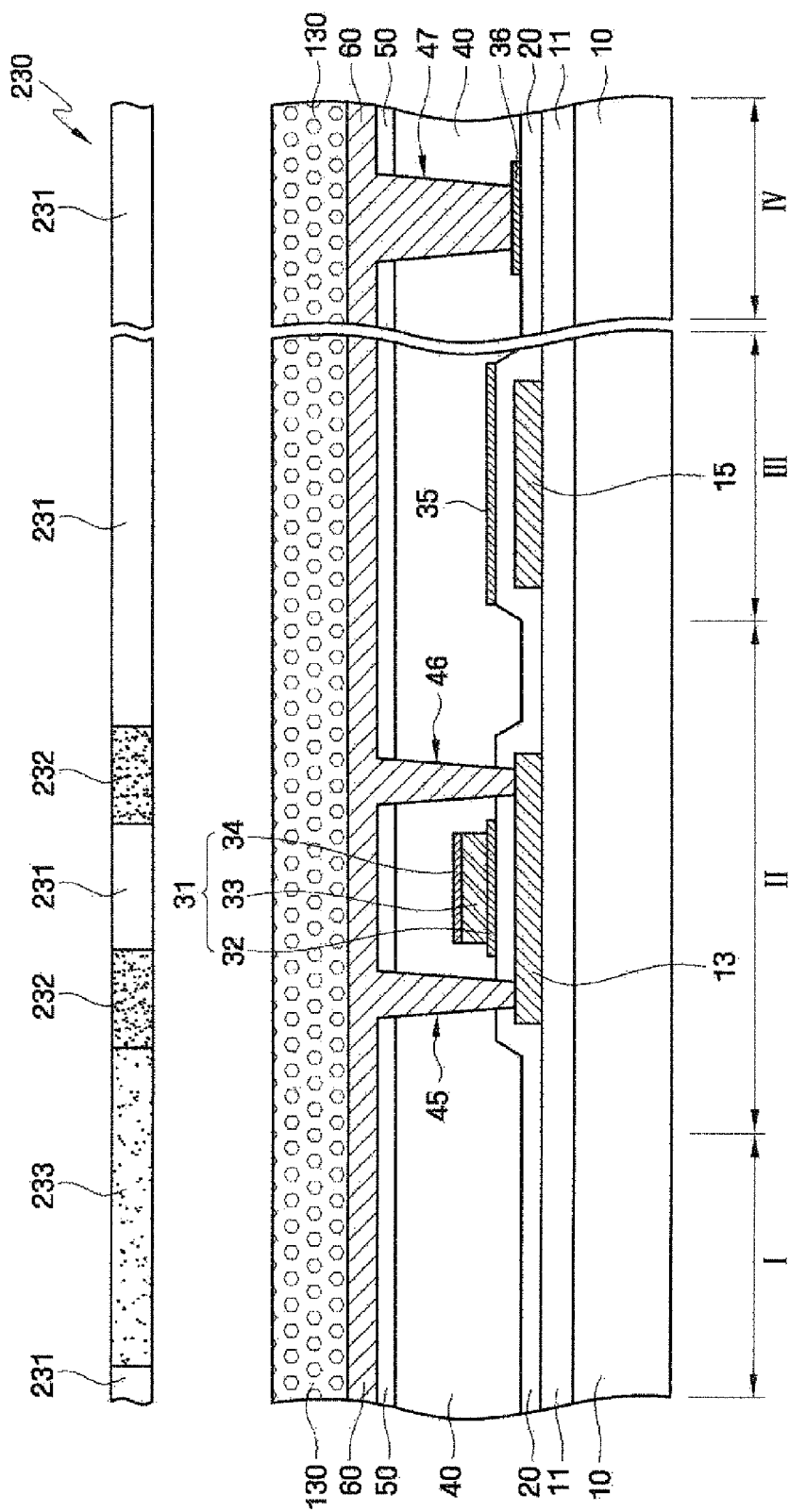

Referring to FIGS. 13 and 14, the third photoresist pattern 121 is removed, and then a conductive film 60 for forming the source and drain electrodes 66 and 65, respectively, is formed on the conductive film 50 for forming the pixel electrode 55. The conductive film 60 for forming the source and drain electrodes 66 and 65, respectively, fills the contact holes 45 and 46 and the hole 47 which exposes the predetermined region of the pad 36.

The conductive film 60 for forming the source and drain electrodes 66 and 65, respectively, may be a single layer of a material selected from the group consisting of Mo, W, MoW, AlNd, Ti, Al, an Al alloy, Ag, and an Ag alloy. Alternatively, the conductive film 60 for forming the source and drain electrodes 66 and 65, respectively, may be made up of two or more layers of Mo, Al or Ag, which is a low-resistance material, in order to reduce wiring resistance. That is, the conductive film 60 for forming the source and drain electrodes 66 and 65, respectively, may have a multilayered structure selected from the group consisting of Mo/Al/Mo, MoW/AlNd/MoW, Ti/Al/Ti, Mo/Ag/Mo, and Mo/Ag alloy/Mo. The conductive film 60 for forming the source and drain electrodes 66 and 65, respectively, may be formed by, e.g., sputtering.

A fourth photoresist film 130 is formed on the conductive film 60 for forming the source and drain electrodes 66 and 65, respectively. A fourth photomask 230 is placed above the fourth photoresist film 130. For ease of description, the case where the fourth photoresist film 130 is a positive photoresist is described as an example. However, the present invention is not limited to this example, and a negative photoresist may also be used as the fourth photoresist film 130.

The fourth photomask 230 is a halftone mask which includes light-transmitting regions 231, light-blocking regions 232, and a semi-transmitting region 233. The fourth photomask 230 is positioned such that the light-blocking regions 232 correspond to regions in which the source and drain electrodes 66 and 65 (see FIG. 1), respectively, are to be formed, and that the semi-transmitting region 233 corresponds to a region in which the pixel electrode 55 (see FIG. 55) is to be formed.

Figure 15:
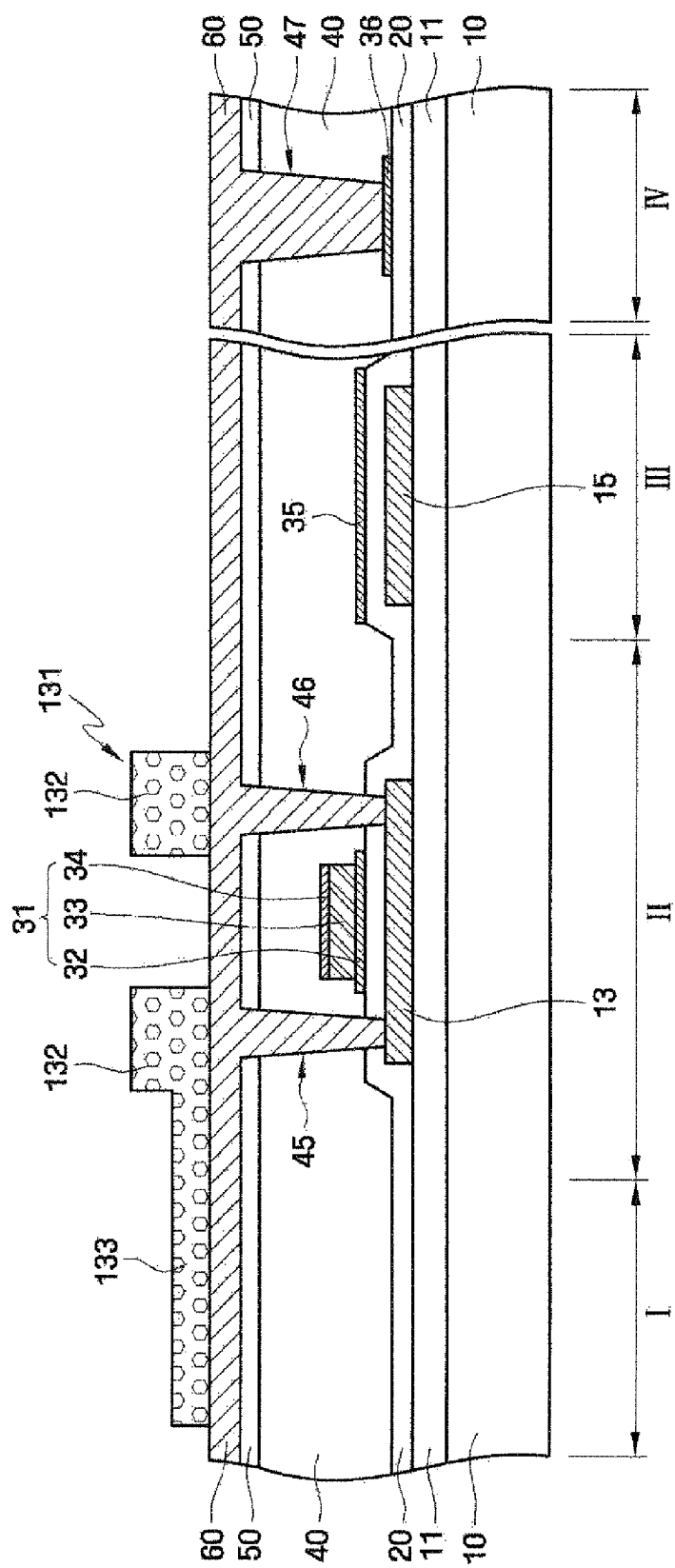

Referring to FIGS. 14 and 15, the fourth photoresist film 130 is exposed to light through the fourth photomask 230 and then developed. As a result, regions of the fourth photoresist film 130 which correspond to the light-transmitting regions 231 are removed, whereas regions of the fourth photoresist film 130 which correspond to the light-blocking regions 232 and the semi-transmitting region 233 remain so as to form a fourth photoresist pattern 131. The fourth photoresist pattern 131 includes third sub-photoresist patterns 132 corresponding to the light-blocking regions 232 and a fourth sub-photoresist pattern 133 corresponding to the semi-transmitting region 233. The fourth sub-photoresist pattern 133 is thinner than the third sub-photoresist patterns 132.

Figure 16:
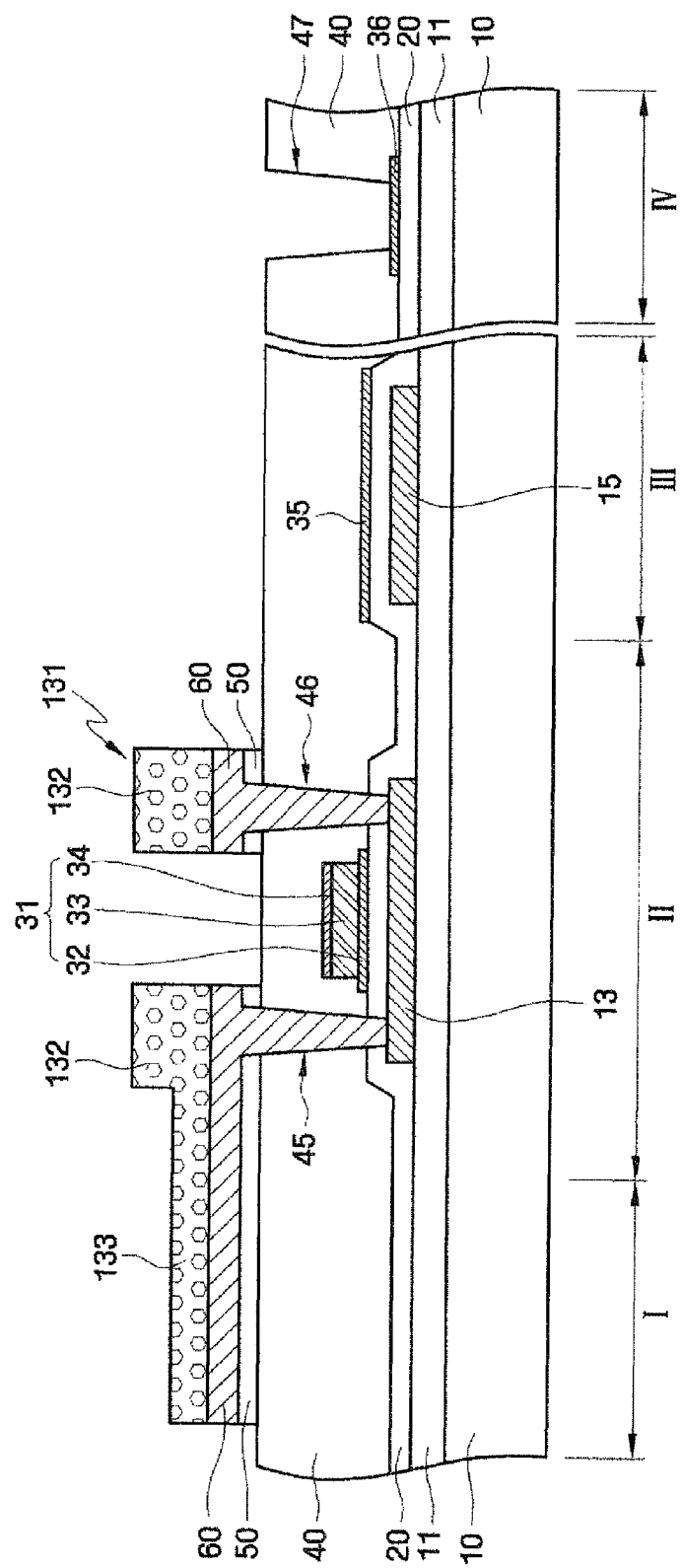

Referring to FIGS. 15 and 16, the conductive film 50 for forming the pixel electrode 55 and the conductive film 60 for forming the source and drain electrodes 66 and 65, respectively, are etched using the fourth photoresist pattern 131 as an etch mask. The conductive film 50 for forming the pixel electrode 55 and the conductive film 60 for forming the source and drain electrodes 66 and 65, respectively, may be wet-etched or dry-etched separately or may be wet-etched simultaneously using an etchant which contains nitric acid and fluorine ions.

Figure 17:
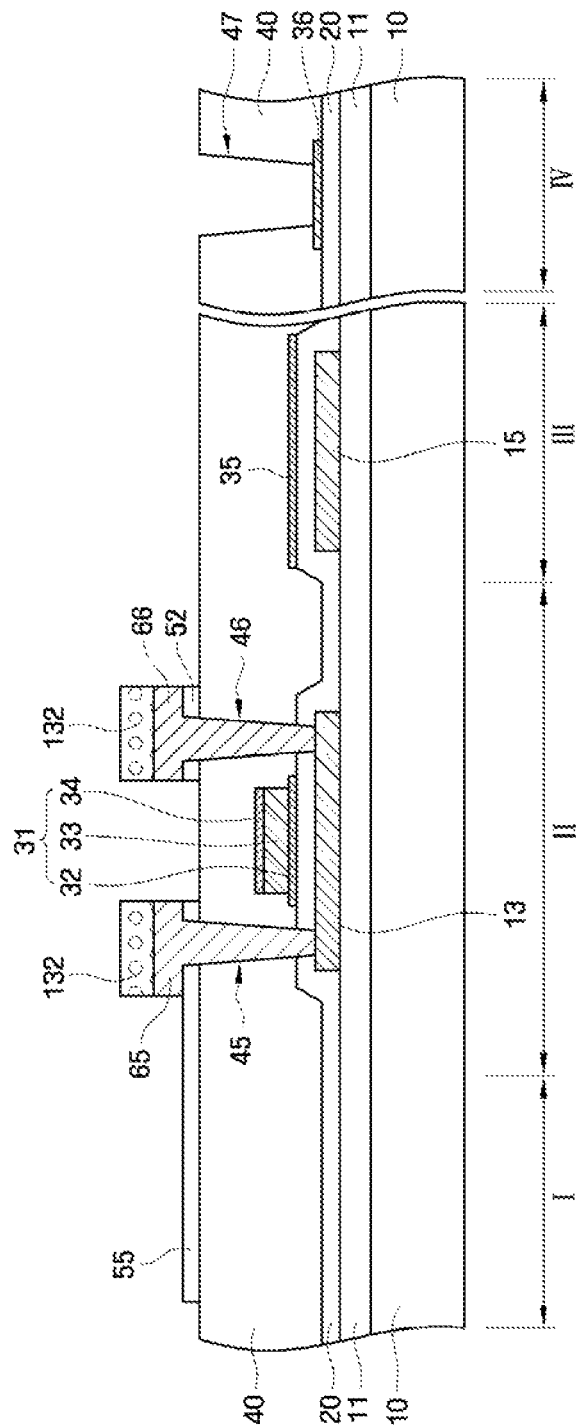

Referring to FIGS. 16 and 17, the fourth sub-photoresist pattern 133 is removed by an ashing process using oxygen. When the fourth sub photoreist pattern 133 is removed, the third sub-photoresist patterns 132 may be partially removed. As a result, the thickness and width of the third sub-photoresist patterns 132 may be reduced.

Next, the conductive film 60 for forming the source and drain electrodes 66 and 65, respectively, is etched using the remaining third photoresist patterns 132 as etch masks. In this regard, the conductive film 60 for forming the source and drain electrodes 66 and 65, respectively, is removed from a light-emitting region I, thus exposing the conductive film 50 for forming the pixel electrode 55 in the light-emitting region I. Consequently, the pixel electrode 55 is formed.

In the TFT region II, any one (e.g., the drain electrode 65) of the source and drain electrodes 66 and 65, respectively, is formed on the pixel electrode 55, and the other one (e.g., the source electrode 66) of the source and drain electrodes 66 and 65, respectively, is formed on a conductive film pattern 52 for forming the pixel electrode 55. Otherwise, the source electrode 66 may be formed on the pixel electrode 55 so as to be in direct contact with the pixel electrode 55, and the drain electrode 65 may be formed on the conductive film pattern 52 for forming the pixel electrode 55 so as to be in direct contact with the conductive film pattern 52 formed on the interlayer insulating film 40.

In the pad region IV, the conductive film 50 for forming the pixel electrode 55 and the conductive film 60 for forming the source and drain electrodes 66 and 65, respectively, are removed, thereby exposing the predetermined region of the pad 36.

According to the current exemplary embodiment, a TFT array substrate can be fabricated using four photomasks 200, 210, 220 and 230. In addition, the second gate electrode film 33 made of low-resistance metal, such as Al, is included in the gate electrode 31, while the pad 36 and the first gate electrode film 36 are made of the same material which does not corrode.

Although the present invention has been described in connection with exemplary embodiments of the present invention with reference to the accompanying drawings, it will be apparent to those skilled in the art that various modifications and changes may be made thereto without departing from the scope and spirit of the invention. Therefore, it should be understood that the above embodiments are not limiting, but rather they are illustrative in all aspects.

What is claimed is:
1. A thin-film transistor (TFT) array substrate, comprising:
 a substrate;
 an active layer and a capacitor first electrode formed on the substrate;
 a gate insulating film formed on the substrate, the active layer and the capacitor first electrode;
 a gate electrode formed on the gate insulating film corresponding to the active layer;

a capacitor second electrode formed on the gate insulating film corresponding to the capacitor first electrode;

an interlayer insulating film formed on the gate insulating film, the gate electrode and the capacitor second electrode; and a pixel electrode, a source electrode and a drain electrode formed on the interlayer insulating film; wherein at least one of the source electrode and the drain electrode is formed on the pixel electrode; and the gate electrode comprises a first gate electrode film, a second gate electrode film and a third gate electrode film stacked sequentially on the gate insulating film.

2. The TFT array substrate of claim 1, wherein the gate electrode and the capacitor second electrode have different thicknesses.

3. The TFT array substrate of claim 1, wherein widths of the second gate electrode film and the third gate electrode film are narrower than a width of the first gate electrode film.

4. The TFT array substrate of claim 1, wherein the first gate electrode film is made of one of Ti, Ta and Cr, the second gate electrode film is made of one of Al, an Al alloy, Ag, an Ag alloy, Cu and a Cu alloy, and the third gate electrode film is made of one of Mo and an Mo alloy.

5. The TFT array substrate of claim 1, wherein the capacitor first electrode is formed by implanting impurity ions into polysilicon.

6. The TFT array substrate of claim 5, wherein the capacitor second electrode contains the impurity ions implanted into the polysilicon to form the capacitor first electrode.

7. The TFT array substrate of claim 1, wherein the pixel electrode is formed on the interlayer insulating film so as to be in direct contact with the interlayer insulating film.

8. The TFT array substrate of claim 7, wherein the drain electrode is formed on the pixel electrode so as to be in direct contact with the pixel electrode.

9. The TFT array substrate of claim 7, wherein the source electrode is formed on the pixel electrode so as to be in direct contact with the pixel electrode.

10. The TFT array substrate of claim 1, wherein the capacitor second electrode is made of a same film as the first gate electrode film.

11. The TFT array substrate of claim 10, wherein the capacitor second electrode has a thickness equal to a thickness of the first gate electrode film.

12. The TFT array substrate of claim 10, further comprising a pad formed on the gate insulating film, wherein the pad is made of a same film as the first gate electrode film.

* * * * *